United States Patent
Eichinger et al.

(10) Patent No.: US 11,024,764 B2
(45) Date of Patent: Jun. 1, 2021

(54) METHOD FOR PRODUCING AN OUTPUT COUPLING ELEMENT FOR AN OPTOELECTRONIC COMPONENT AND OPTOELECTRONIC COMPONENT

(71) Applicant: OSRAM OLED GmbH, Regensburg (DE)

(72) Inventors: Christian Eichinger, Wenzenbach (DE); Maja Hackenberger, Nittendorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/498,966

(22) PCT Filed: Mar. 27, 2018

(86) PCT No.: PCT/EP2018/057785
§ 371 (c)(1),
(2) Date: Sep. 27, 2019

(87) PCT Pub. No.: WO2018/184917
PCT Pub. Date: Oct. 11, 2018

(65) Prior Publication Data
US 2020/0058826 A1    Feb. 20, 2020

(30) Foreign Application Priority Data

Apr. 6, 2017   (DE) .................... 10 2017 107 432.5

(51) Int. Cl.
*B32B 37/14*    (2006.01)
*C04B 35/115*   (2006.01)
(Continued)

(52) U.S. Cl.
CPC .......... *H01L 33/0075* (2013.01); *H01L 33/22* (2013.01)

(58) Field of Classification Search
CPC . H01L 33/0093; H01L 33/28; H01L 33/0075; G03B 21/28
See application file for complete search history.

(56) References Cited

U.S. PATENT DOCUMENTS

| 8,129,212 B2 | 3/2012 | Wijekoon et al. |
| 2003/0196986 A1 | 10/2003 | Tsung-Kuei et al. |

(Continued)

FOREIGN PATENT DOCUMENTS

| CN | 103730350 A | * | 4/2014 |
| DE | 102005041877 A | | 3/2007 |

(Continued)

OTHER PUBLICATIONS

Machine translation of CN103730350A (Year: 2014).*
(Continued)

*Primary Examiner* — Brian Turner
(74) *Attorney, Agent, or Firm* — Slater Matsil. LLP

(57) ABSTRACT

A method for producing an output coupling element and an optoelectronic component are disclosed. In an embodiment, a method includes providing an inorganic dielectric element with a surface in a chamber, wherein the inorganic dielectric element rotates in the chamber during operation and providing a structuring agent comprising water and ozone and introducing the structuring agent into the chamber so that the structuring agent contacts the surface of the inorganic dielectric element and a roughening is produced in the surface, wherein the inorganic dielectric element comprises aluminum oxide.

15 Claims, 9 Drawing Sheets

(51) Int. Cl.
*H01L 33/50* (2010.01)
*H01K 1/26* (2006.01)
*H01L 33/00* (2010.01)
*H01L 33/22* (2010.01)

(56) References Cited

U.S. PATENT DOCUMENTS

| | | | |
|---|---|---|---|
| 2010/0133529 A1* | 6/2010 | Taraschi | H01L 33/0093 257/43 |
| 2010/0326476 A1* | 12/2010 | Rho | G03F 7/422 134/26 |
| 2011/0210425 A1 | 9/2011 | Su et al. | |
| 2015/0014695 A1 | 1/2015 | Cich et al. | |
| 2015/0093847 A1 | 4/2015 | Cha et al. | |
| 2015/0247618 A1* | 9/2015 | Irie | C09K 11/7774 362/84 |
| 2016/0313494 A1* | 10/2016 | Hamilton | G02B 5/0294 |

FOREIGN PATENT DOCUMENTS

| | | |
|---|---|---|
| EP | 2384086 A1 | 11/2011 |
| WO | 2010033910 A1 | 3/2010 |

OTHER PUBLICATIONS

Chang, H.S. et al., "Study on Light Intensity Enhancement of ZnO/ITO/p-GaN Light-Emitting Diodes," Applied Mechanics and Materials, vols. 130-134, Oct. 1, 2011, 6 pages.

Lu, H.W. et al., "The Effects of Ultraviolet-Ozone-Treated Ultra-Thin MnO-Doped ZnO Film as Anode Buffer Layer on the Electrical Characteristics of Organic Light-Emitting Diodes," Journal of Applied Physics, American Institute of Physics, vol. 118, No. 18, Nov. 14, 2015, 7 pages.

Dan Zhang, et al, "Characterization of Critically Cleaned Sapphire Single-Crystal Substrates by Atomic Force Microscopy, XPS and Contact Angle Measurements," Applied Surface Science, journal homepage: www.elsevier.com/locate/apsusc, Jan. 5, 2013, 13 pages.

* cited by examiner

|     | -0.002 | nm |
| --- | --- | --- |
| Ra | 24.068 | nm |
| Rp | 0.224 | μm |
| Rq | 31.05 | nm |
| Rt | 0.416 | μm |
| Rv | -0.192 | μm |

|  | 0.001 | nm |
| --- | --- | --- |
| Ra | 18.866 | nm |
| Rp | 0.212 | μm |
| Rq | 22.357 | nm |
| Rt | 0.374 | μm |
| Rv | -0.162 | μm |

METHOD FOR PRODUCING AN OUTPUT COUPLING ELEMENT FOR AN OPTOELECTRONIC COMPONENT AND OPTOELECTRONIC COMPONENT

This patent application is a national phase filing under section 371 of PCT/EP2018/057785, filed Mar. 27, 2018, which claims the priority of German patent application 102017107432.5, filed Apr. 6, 2017, each of which is incorporated herein by reference in its entirety.

TECHNICAL FIELD

The invention relates to a method for producing an output coupling element for an optoelectronic component. Furthermore, the invention relates to an optoelectronic component, which in particular comprises an output coupling element.

BACKGROUND

So far, inorganic semiconductor layers, if applicable dielectric layers or semiconductor layers, have been roughened using wet chemistry. Potassium hydroxide solution, for example, can serve this purpose. In this way, a statistical distribution of the roughening structure sizes can be achieved. Alternatively, the roughening can also be produced by plasma structuring. In this way, defined structures can be produced.

SUMMARY OF THE INVENTION

Embodiments provide a method for producing an output coupling element for an optoelectronic component that efficiently and simply produces an output coupling element. Further embodiments provide an optoelectronic component with an output coupling element.

In at least one embodiment, the method for producing an output coupling element for an optoelectronic component comprises the following method steps: A) providing an inorganic dielectric element. The dielectric element comprises a surface. The dielectric element is introduced into a chamber. The dielectric element and/or a carrier are configured to rotate during operation. Alternatively or additionally, the chamber can also rotate during operation.

The method comprises step B), which contains providing a structuring agent and introducing the structuring agent into the chamber. The structuring agent comprises ozone and water or consists thereof. The structuring agent can contact the surface of the inorganic dielectric element, in particular contact it directly, and thus produce a roughening in the surface.

Direct contact here means direct mechanical contact of the structuring agent with the surface of the inorganic dielectric element.

Inorganic dielectric element here means that the element, which is formed in particular as a layer, comprises dielectric properties. In addition, the dielectric element is formed exclusively of inorganic materials.

The inventors have recognized that with the method described here a roughening in the inorganic dielectric element can be produced, so that the output coupling element comprises a very good light extraction. In addition, the method described here is easy to apply.

According to at least one embodiment, the method comprises a step A), providing an inorganic dielectric element. The inorganic dielectric element can be formed as a layer. In particular, the inorganic dielectric element comprises a homogeneous layer thickness of, for example, between 20 nm and 150 nm. In principle, thicker layers with layer thicknesses greater than 150 nm can also be used. The inorganic dielectric element comprises a surface. In particular, the surface is accessible for the structuring agent. In step A), the inorganic dielectric element is arranged in a chamber. The dielectric element and/or the carrier with the wafers rotate during operation, in particular around their axis of rotation. The inorganic dielectric element can be introduced into the chamber.

According to at least one embodiment, the inorganic dielectric element comprises an oxide or nitride of a metal or consists thereof. The metal can be aluminum, for example.

According to at least one embodiment, the inorganic dielectric element comprises aluminum oxide ($Al_2O_3$). Alternatively, the inorganic dielectric element consists of aluminum oxide.

According to at least one embodiment, the method comprises a step B). In method step B), the structuring agent is provided. The structuring agent comprises water and ozone. The structuring agent is introduced into the chamber. Thus, the structuring agent can contact the surface of the inorganic dielectric element, in particular contact it directly, and produce a roughening in the surface.

According to at least one embodiment, the mean roughness Rq during or after step B) is between including 20 nm and including 50 nm, in particular between including 22 nm and including 40 nm, in particular between including 25 nm and including 35 nm, in particular between including 25 nm and including 32 nm, for example, 30 nm.

Preferably, the mean roughness Rq after step B) is between 20 nm and 30 nm. The mean roughness Rq can be determined by white light interferometry (WLI). WLI is a non-contact optical measurement method which exploits the interference of broadband light (white light) and allows so-called three-dimensional profile measurements of structures with dimensions between a few centimeters and a few micrometers. White light interferometry is sufficiently well known to a person skilled in the art and is therefore not further explained at this point.

In particular, the mean roughness Rq is given here for layer thicknesses between including 20 nm and including 150 nm, in particular between including 35 nm and including 85 nm, for example, between including 40 nm and including 80 nm of the organic dielectric element.

The term mean roughness Rq is known to a person skilled in the art and is therefore not explained in more detail at this point. The mean square roughness Rq can be the mean square value of the profile deviation.

According to at least one embodiment, the structuring agent comprises water and ozone. In particular, the water is deionized. Deionized water here means that the water has been freed from its ions by different methods. This water is characterized by its low conductivity.

The structuring agent comprises ozone. By using the structuring agent, i.e., a mixture of ozone and water, a structuring or roughening can be produced in the surface of the inorganic dielectric element.

According to at least one embodiment, ozone is introduced into the chamber in gaseous form. In addition, water in particular is introduced in liquid form. During the rotation of the inorganic dielectric element in the chamber, the water forms a thin film of water on the surface of the inorganic dielectric element, wherein the ozone is cleaved into radicals, is easily accessible to the dielectric element and thus causes a roughening of the surface of the inorganic dielectric element.

According to at least one embodiment, the structuring agent additionally comprises a base or an acid, wherein the base acts catalysing and the acid inhibiting. A base is a chemical compound with a pH value greater than 7. The base can be dissolved in water, i.e., an aqueous base can be present. Ammonia, for example, can be used as a base. Ammonia can be used here as a catalyst which contributes to the dissociation of the ozone.

According to at least one embodiment, the concentration of ammonia is less than or equal to 0.05%. The term % here refers to volume percent.

According to at least one embodiment, the ozone, in particular the gaseous ozone, is introduced into the chamber with a concentration between 180 g/m$^3$ and 250 g/m$^3$, for example, 240 g/m$^3$.

According to at least one embodiment, the structuring agent in step B) comprises a temperature between including room temperature and including 90° C., in particular 40° C., for example. The reaction temperature should not be below 40° C. in order to produce an optimal roughening on the surface of the inorganic dielectric element. It has been shown that in particular an optimal result in relation to the reaction rate at a reaction temperature of about 40° C. could be observed.

The carrier in or on which the wafers are arranged can have a rotational speed between 5 rpm or 25 rpm and 1200 rpm. The thinner the water film contacting the surface of the inorganic dielectric element is, the greater is the amount of ozone that can reach the surface. This results in an optimal roughening of the surface of the inorganic dielectric element.

According to at least one embodiment, the method comprises a further step after step B), drying of the inorganic dielectric element. In other words, after the roughening of the surface of the inorganic dielectric element, the structuring agent can be removed again.

In the subsequent method step, the inorganic dielectric element can be purged with a gas, such as nitrogen, or compressed air (CDA). Inert gas and/or compressed air can be used.

According to at least one embodiment, the carrier in the chamber comprises a rotation speed of 25 RPM to 1200 RPM during operation, typically 1000 RPM.

According to at least one embodiment, the inorganic dielectric element is formed as a layer with a layer thickness between including 20 nm and including 150 nm.

According to at least one embodiment, the inorganic dielectric element is treated with the structuring agent between including 5 minutes and including 20 minutes.

The inventors have recognized that, by the method described here, a micro-roughness can be produced in the inorganic dielectric element, which is in particular an aluminum oxide layer. The method preferably uses a wet chemical etching with a structuring agent of at least deionized water and ozone. In addition, ammonia can be added.

The adjustment of the roughness dimension of the layer thickness change of the inorganic dielectric element is possible. The conventional methods cannot cover the complete dimensional spectrum up to smaller structure sizes.

Embodiments of the invention further relate to an optoelectronic component. Preferably, the optoelectronic component comprises an output coupling element. The optoelectronic component is preferably produced with the method described here. All definitions and embodiments of the method also apply to the optoelectronic component and vice versa.

According to at least one embodiment, the optoelectronic component comprises a semiconductor layer sequence. The semiconductor layer sequence is configured for radiation emission. Alternatively, the optoelectronic component can also comprise an organic layer sequence. The optoelectronic component comprises an output coupling element. The output coupling element comprises at least an inorganic dielectric element with a surface. The inorganic dielectric element can comprise a mean roughness, here also referred to as Rq, between including 20 nm and including 30 nm.

According to at least one embodiment, the optoelectronic component comprises a semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein $0 \leq n \leq 1$, $0 \leq m \leq 1$ and $n+m \leq 1$ respectively. The semiconductor layer sequence can comprise dopants as well as additional components. For the sake of simplicity, however, only the essential components of the crystal lattice of the semiconductor layer sequence are indicated, i.e., Al, As, Ga, In, N or P, even if these may be partially replaced and/or supplemented by small quantities of other substances.

The semiconductor layer sequence comprises one or more active layers. The at least one active layer is configured for generating electromagnetic radiation. For example, the active layer contains at least one pn junction or at least one quantum well. In particular, ultraviolet, visible and/or near infrared light or radiation is generated in the active layer during operation of the optoelectronic component. The radiation generated in the active layer comprises a peak wavelength. The peak wavelength is the wavelength at which the highest radiation intensity is generated during intended operation.

According to at least one embodiment, the optoelectronic component is a light-emitting diode, LED for short.

According to at least one embodiment, the optoelectronic component is formed as an organic light-emitting diode (OLED).

According to at least one embodiment, the component comprises a substrate. For example, the substrate can comprise one or more materials in form of a layer, a plate, a foil or a laminate selected from gas, quartz, plastic, metal, silicon wafer, ceramic coated paper. The substrate preferably comprises glass, for example, in form of a glass layer, glass foil or glass plate or consists thereof.

According to at least one embodiment, the optoelectronic component comprises a first and a second electrode. At least one of these electrodes is formed transparent. Here and in the following, transparent refers to a layer that is permeable for visible light. Alternatively, both electrodes can also be transparent, so that the component is designed as a so-called double-sided emitting OLED.

For example, a transparent conductive oxide (TCO) such as ITO can be used as the material for a transparent electrode.

Furthermore, a transparent electrode can also comprise a metal layer with a metal or alloy, for example, with one or more of the following materials: silver, platinum, gold, magnesium or an alloy of silver and magnesium.

In particular, one electrode forms the anode while the other electrode forms the cathode.

According to at least one embodiment, the component as an OLED comprises an organic functional layer stack. During operation of the optoelectronic component, radiation is generated in the organic functional layer stack. A wavelength of the radiation or the maximum wavelength is preferably in the infrared and/or ultraviolet and/or visible spectral range, in particular at wavelengths between including 420 nm and including 680 nm.

The organic functional layer stack can comprise layers with organic polymers, organic oligomers, organic monomers, organic small light polymeric molecules (small molecules) or combinations thereof. The organic functional layer stack can comprise additional functional layers which are designed as hole transport layers in order to enable an effective hole injection into the at least one functional layer stack. The organic functional layer stack can further comprise at least one functional layer which is designed as an electron transport layer. In general, the organic functional layer stack can comprise additional layers selected from hole injection layers, hole transport layers, electron injection layers, electron transport layers, hole blocking layers and electron blocking layers. In particular, the layers of the organic functional layer stack can be completely or at least predominantly organic functional layers. In addition, it can also be possible that individual layers of the organic functional layer stack comprise inorganic materials or are formed thereof.

The optoelectronic component can also comprise current expansion structures.

BRIEF DESCRIPTION OF THE DRAWINGS

Further advantages, advantageous embodiments and further developments result from the exemplary embodiments described in connection in the following.

In the exemplary embodiments and in the figures, identical, similar and similarly acting elements can each be provided with the same reference signs. The elements shown and their proportions among each other are not to be regarded as true to scale. Rather, individual elements, such as layers, components, devices and areas, can be displayed exaggeratedly large for better representability and/or better understanding.

DETAILED DESCRIPTION OF ILLUSTRATIVE EMBODIMENTS

Figure 1A:
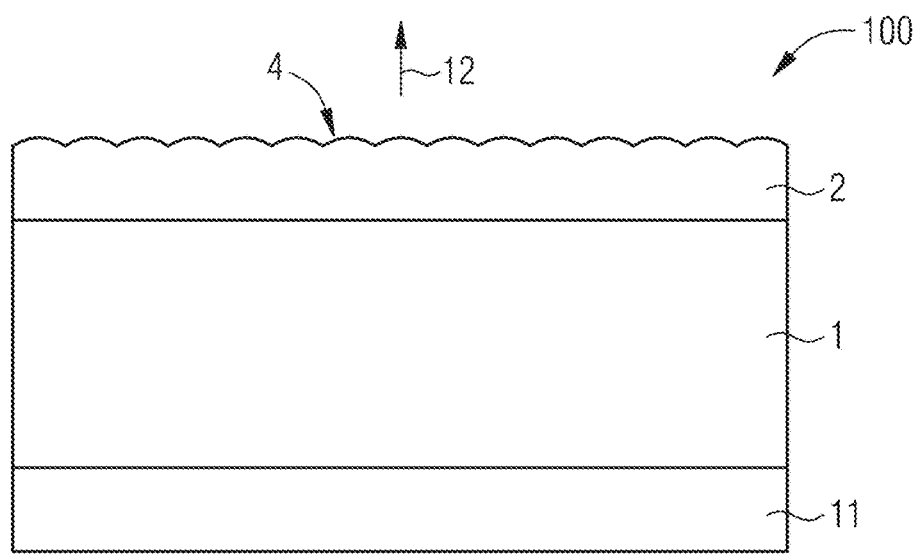
FIGS. 1A to 1C show an optoelectronic component according to an embodiment.
Figure 1B:
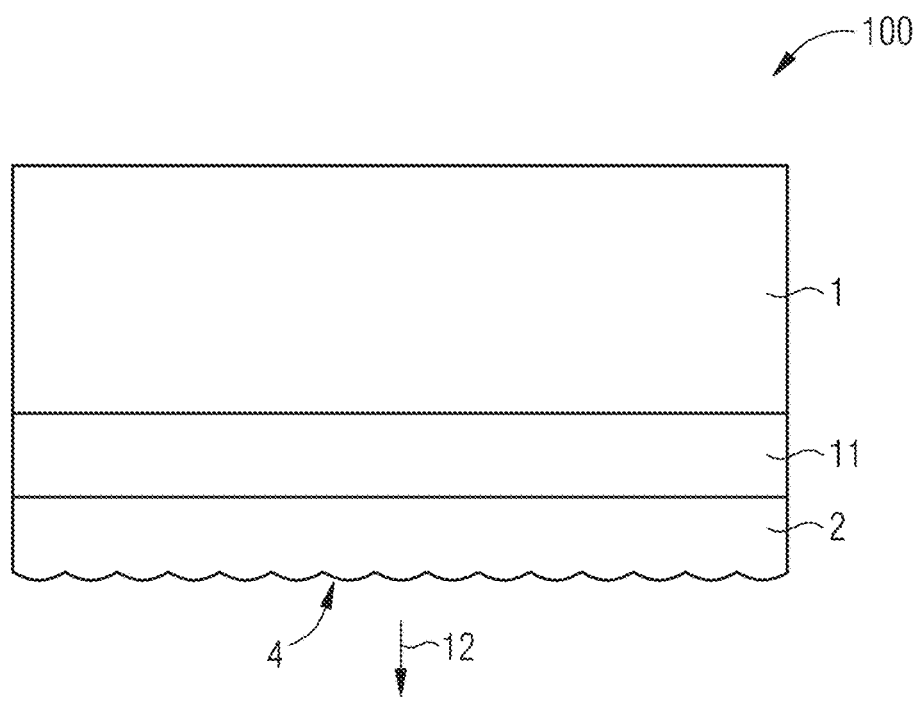
Figure 1C:
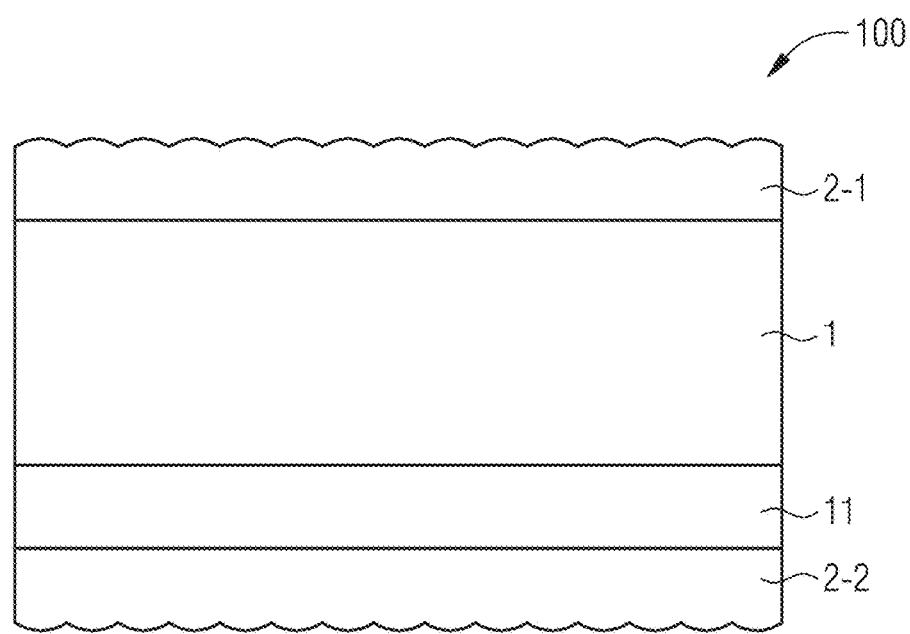

FIGS. 1A to 1C each show a schematic side view of an optoelectronic component according to an embodiment. The optoelectronic component comprises a substrate 11, also known as a carrier. A semiconductor layer sequence 1 or an organic layer sequence 1 is arranged on the carrier 11. In the case of a semiconductor layer sequence 1, this semiconductor layer sequence is grown epitaxially on a sapphire substrate, for example. In the case of an OLED, an organic layer sequence 1 is applied to a glass substrate 11, for example.

FIG. 1A shows that the output coupling element 2 is arranged on the semiconductor layer sequence 1, in particular directly. The output coupling element 2 comprises a structuring on the surface 4. The structuring is produced as a result of the roughening with the method described here. The structuring or roughening comprises a mean roughness in particular between including 10 nm and including 50 nm, for example, between including 20 nm and including 30 nm. The light generated in semiconductor layer sequence 1 can be decoupled 12 from component 100 via the output coupling element 2.

In contrast, FIG. 1B shows that the output coupling element 2 is arranged directly on the back of carrier 11. In particular, as shown in FIG. 1A, the radiation generated in semiconductor layer sequence 1 can be decoupled upwards, i.e., in the opposite direction of carrier 11. In the case of FIG. 1B, the radiation is decoupled from component 100 via the carrier 11 and the output coupling element 2.

FIG. 1C shows a combination of the arrangement of the output coupling element 2 of FIGS. 1A and 1B. Two output coupling elements 2 are present in the component of FIG. 1C. One output coupling element 2-1 is applied directly to the semiconductor layer sequence 1. The second output coupling element 2-2 is applied to a side of carrier 11 opposite the semiconductor layer sequence 1, in particular directly.

Preferably, aluminum oxide is used as the material for the inorganic dielectric element 3 in the output coupling element 2-1, 2-2 or in the output coupling elements 2-1, 2-2 described here.

Figure 2A:
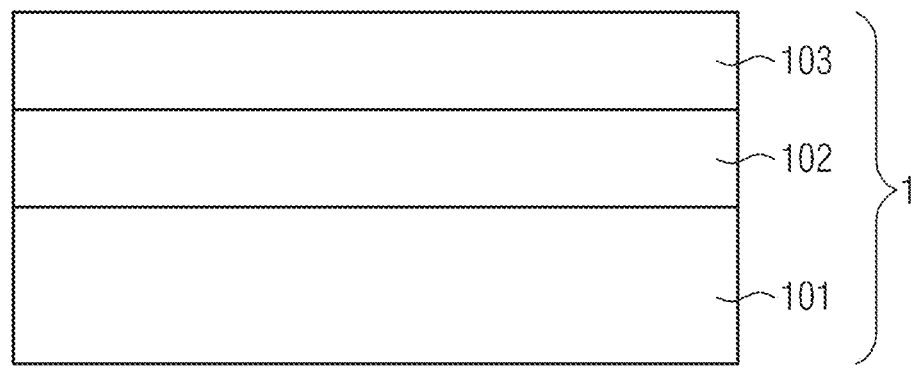
FIGS. 2A to 2B show a semiconductor layer sequence or an organic layer sequence according to an embodiment.
Figure 2B:
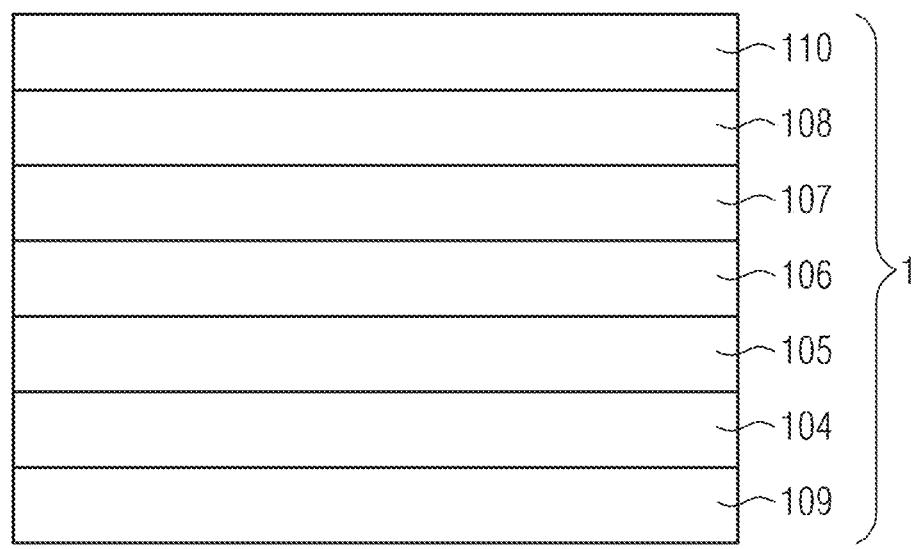

FIGS. 2A and 2B show a schematic side view of a semiconductor layer sequence 1 or an organic layer sequence 1 according to an embodiment.

FIG. 2A shows an n-doped semiconductor layer 101, an active layer 102 arranged thereon, and a p-doped semiconductor layer 103 arranged thereon. These layers can form the epitaxially grown semiconductor layer sequence 1 of an inorganic light emitting diode (LED).

In comparison, as shown in FIG. 2B, the layer sequence is formed organically. The layer sequence here is in particular a layer sequence 1 of an OLED. The layer sequence comprises a hole transport layer 104, a light injection layer 105, an emission layer 106, an electron transport layer 107 and an electron injection layer 108. These organic layers can be arranged between two electrodes 109 and 110.

FIGS. 3A to 3E show a method for producing an output coupling element 2 for an optoelectronic component 100.

Figure 3A:
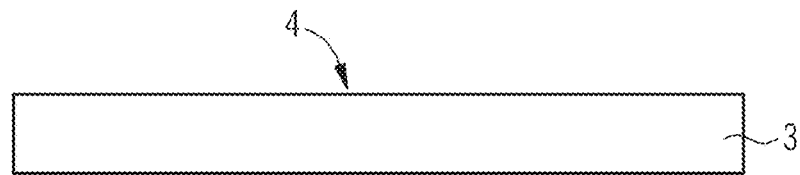
FIGS. 3A to 3E show a method for producing an optoelectronic component according to an embodiment, FIGS. 4A to 4C each show an electro-microscope image (SEM) according to one embodiment each.
Figure 3B:
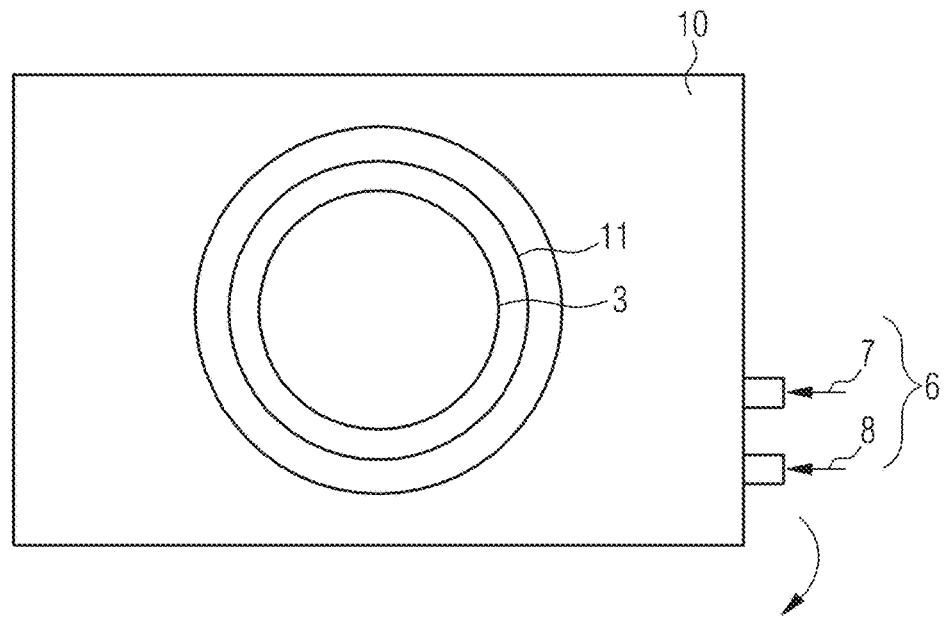

FIG. 3A shows providing an inorganic dielectric element 3 with a surface 4. The inorganic dielectric element 3 is introduced into a chamber 10 as shown in FIG. 3B. The carrier 11 and/or the inorganic dielectric element 3 are configured to rotate during operation. In this way, a uniform application of the structuring agent 6 to the inorganic dielectric element 3, which can be arranged on a wafer, can be produced in chamber 10, wherein a uniform roughening is produced in surface 4.

The structuring agent 10 can be added via separate inlets. The structuring agent can comprise water 7 and ozone 8. In addition, ammonia can also be added as a catalyst (not shown here).

Figure 3C:

FIG. 3C shows the inorganic dielectric element 3, which comprises a roughening in surface 4. The roughening can have any possible structure, such as pyramidal or truncated cone-like.

Figure 3D:
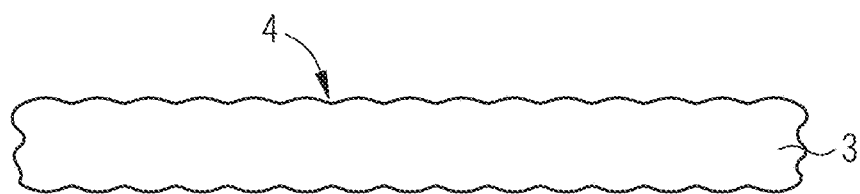

The FIG. 3D shows that not only the surface 4 has been structured, but also the side opposite the surface 4 of the inorganic dielectric element 3 is structured.

Figure 3E:
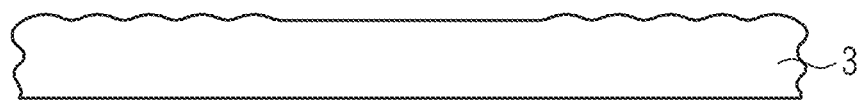

FIG. 3E shows that the roughening of the inorganic dielectric element 3 here was performed area by area. For example, before introducing the inorganic dielectric element 3, certain areas on the surface 4, which should not be roughened, can be masked. After the treatment of the inorganic dielectric element 3 in the chamber 10 and after step B), this mask can be removed again, so that areas are produced on the surface which are roughened and areas are produced which comprise no roughening.

Figure 4A:
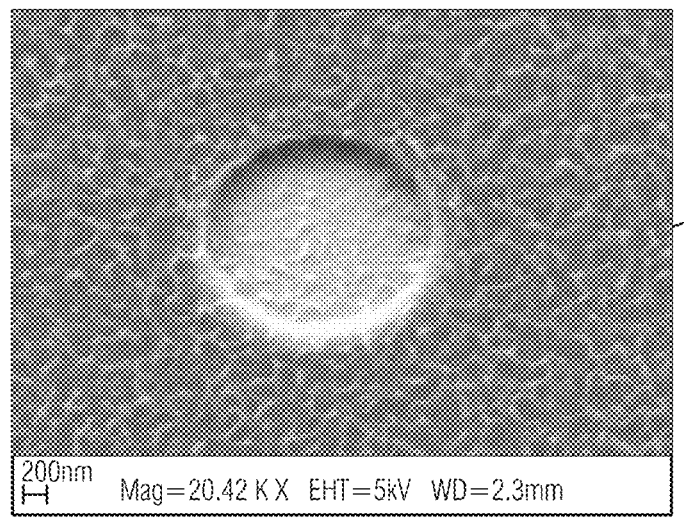
Figure 4B:
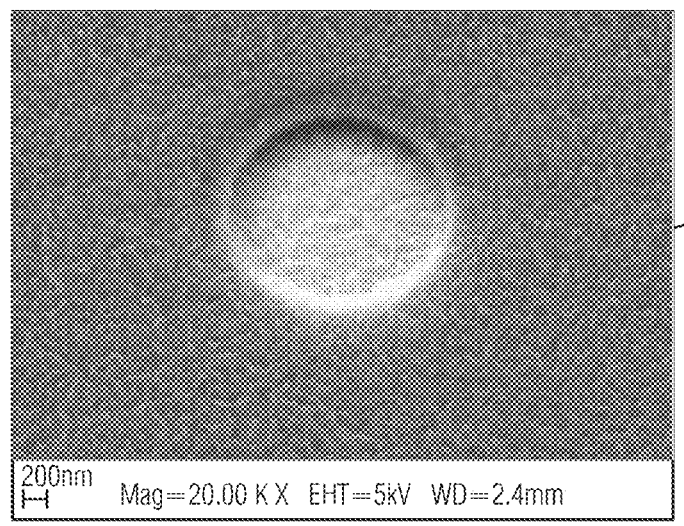
Figure 4C:
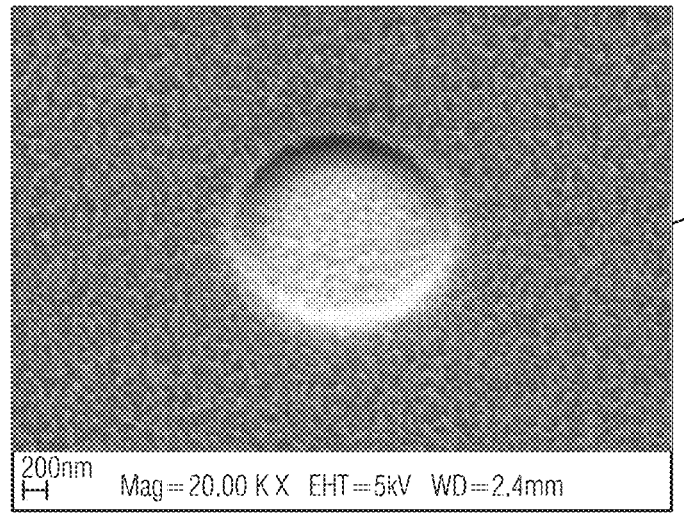

FIGS. 4A to 4C each show an electron microscope image (SEM) according to one embodiment.

FIGS. 4A to 4C each show an inorganic dielectric element 2 with a surface 4 comprising the roughening. In the center of the respective section of the electron microscope images, a circular arrangement is applied. For example, this can be an additional element arranged on the inorganic dielectric element 3.

Figures 5A, 5B:
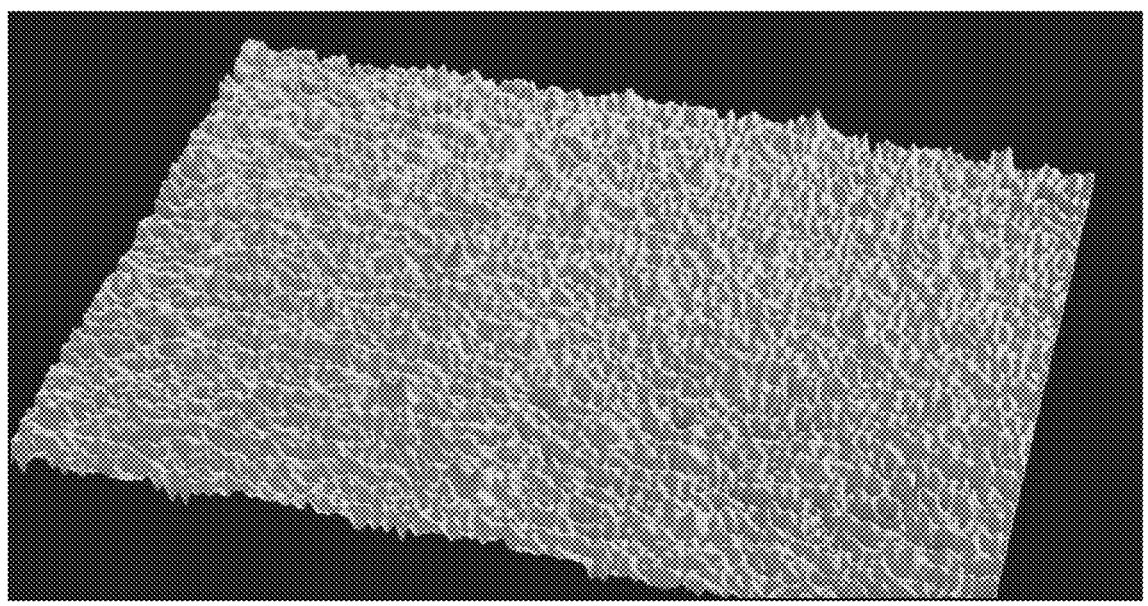
FIGS. 5A and 5C show a three-dimensional profile measurement by white light interferometry according to an embodiment.
FIGS. 5B and 5D show the corresponding measured values of the 3D profile measurement of FIGS. 5B and 5C, respectively.
Figures 5C, 5D:
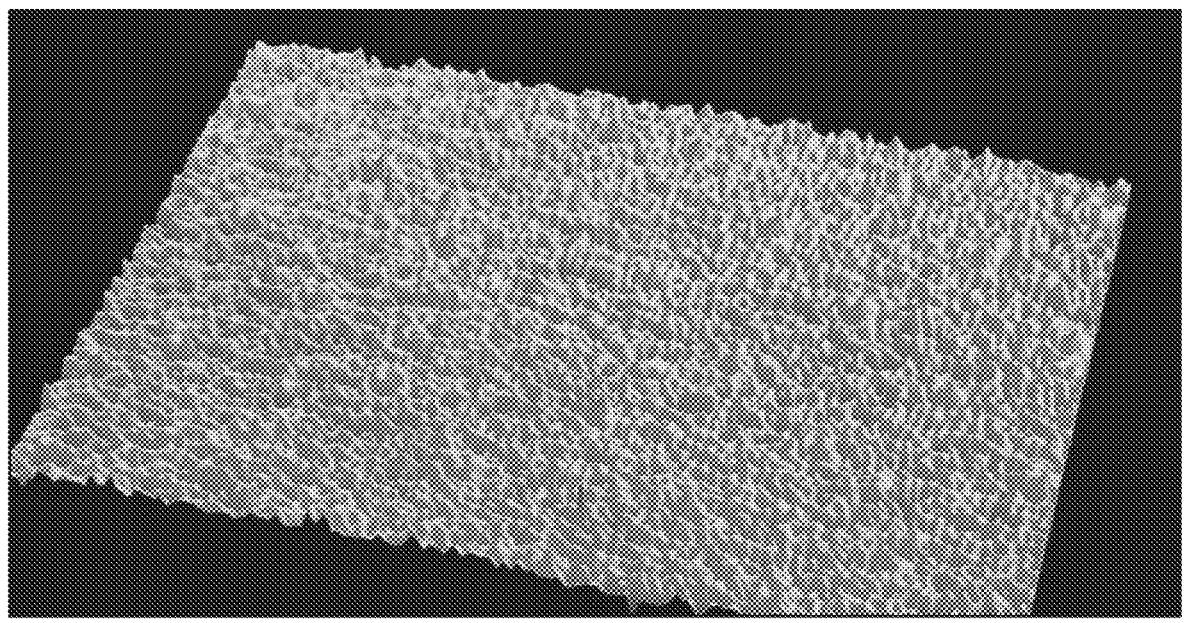

FIGS. 5A and 5C show a three-dimensional profile structure of a white light interferometry measurement according to one embodiment each.

FIGS. 5B and 5D each show the corresponding measured values from the 3D profile measurements. The table in FIG. 5B shows the results of the measurement in FIG. 5A. The table in FIG. 5D shows the results of the measurements in FIG. 5C. Tables 5B and 5D respectively show Ra values, Rp values, Rq values, Rt values and Rv values (mean square roughness value Rq, mean arithmetic roughness value Ra, roughness depth Rt, mean smoothing depth Rp and mean groove depth Rv).

The tables in FIGS. 5B and 5D indicate that the measurements here comprise an Rq value of 31.05 nm or 22.35 nm, respectively. In other words, a mean roughness Rq of between including 20 nm and including 35 nm, in particular between including 22 nm and including 30 nm, can be produced by the method described here. The layer thicknesses of the dielectric element 3 determined here are, for example, between 40 nm and 80 nm. Thicker or thinner layers are also possible.

Figure 6A:
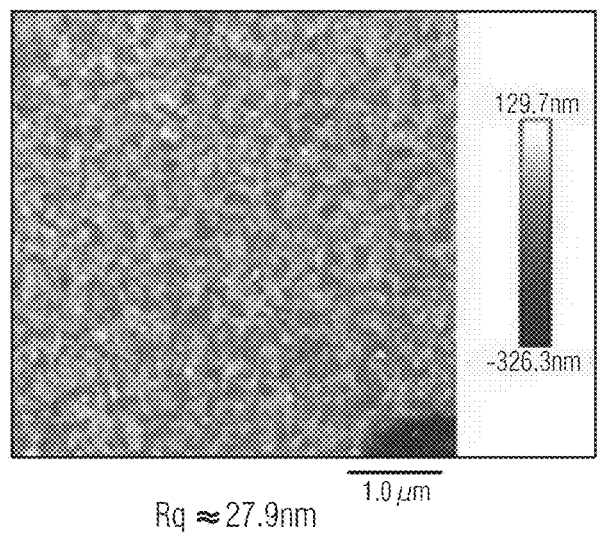
FIGS. 6A and 6B show AFM measurements according to one embodiment.
Figure 6B:
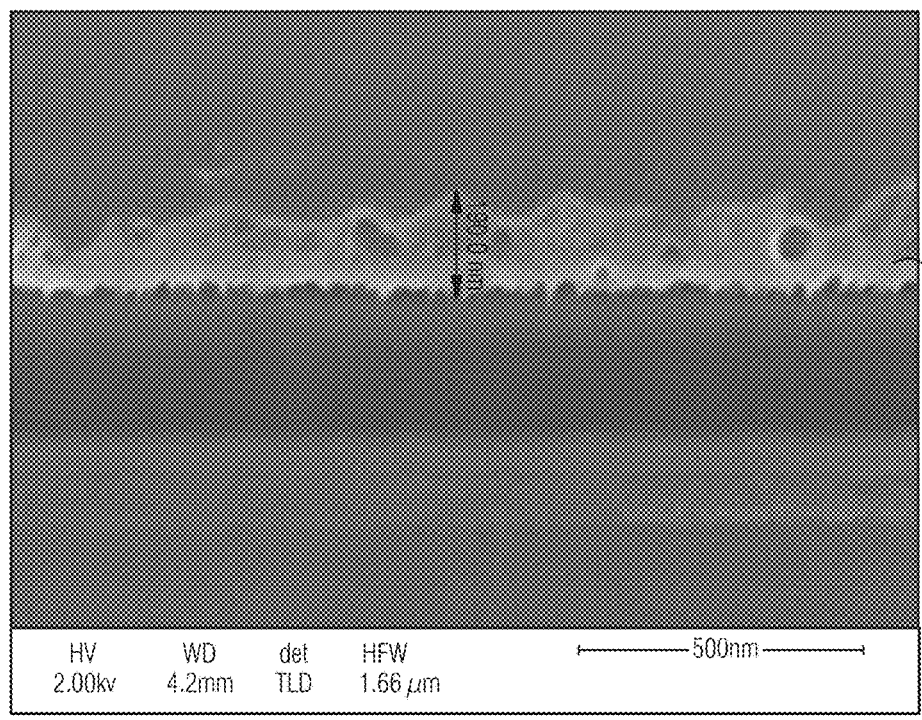

FIGS. 6A and 6B show atomic force microscope images (AFM) according to one embodiment. The inorganic dielectric element 3 is here formed from aluminum oxide. The layer thickness of the inorganic dielectric element 3 is 190 nm. The mean roughness Rq has a value of about 27.9 nm.

The exemplary embodiments described in connection with the figures and their features can also be combined with each other according to further exemplary embodiments, even if such combinations are not explicitly shown in the figures. Furthermore, the exemplary embodiments described in connection with the figures can comprise additional or alternative features according to the description in the general part.

The invention is not limited to the exemplary embodiments by the description of the exemplary embodiments. Rather, the invention includes each feature as well as each combination of features which, in particular, includes each combination of features in the patent claims, even if that feature or combination itself is not explicitly stated in the patent claims or exemplary embodiments.

The invention claimed is:

1. A method for producing an output coupling element for an optoelectronic component, the method comprising:
    A) providing an inorganic dielectric element with a surface in a chamber, wherein the inorganic dielectric element rotates in the chamber during operation; and
    B) providing a structuring agent comprising water and ozone and introducing the structuring agent into the chamber so that the structuring agent contacts the surface of the inorganic dielectric element and a roughening is produced in the surface,
    wherein the inorganic dielectric element comprises aluminum oxide.

2. The method according to claim 1, wherein the inorganic dielectric element is formed of an oxide or nitride of a metal.

3. The method according to claim 1, wherein a mean roughness of the roughening is between 20 and 30 nm.

4. The method according to claim 1, wherein the structuring agent additionally comprises a base.

5. The method according to claim 4, wherein the base is ammonia.

6. The method according to claim 5, wherein a concentration of the ammonia is less than or equal to 0.05%.

7. The method according to claim 1, wherein the ozone is introduced into the chamber in gaseous form.

8. The method according to claim 1, wherein a concentration of the ozone is 180 g/m$^3$ to 250 g/m$^3$.

9. The method according to claim 1, wherein the water is deionized.

10. The method according to claim 1, wherein the structuring agent comprises a temperature between including room temperature and including 90° C.

11. The method according to claim 1, wherein the chamber and/or a carrier comprises a rotational speed of 5 rpm to 1200 rpm during operation.

12. The method according to claim 1, wherein the inorganic dielectric element is formed as a layer with a layer thickness between 20 nm and 150 nm.

13. The method according to claim 1, wherein the inorganic dielectric element is treated with the structuring agent between 5 minutes and 20 minutes.

14. An optoelectronic component comprising:
    a semiconductor layer sequence configured to emit radiation; and
    an output coupling element comprising at least one inorganic dielectric element with a surface,
    wherein the inorganic dielectric element comprises a mean roughness between including 20 nm and including 30 nm, and
    wherein the inorganic dielectric element consists of aluminum oxide.

15. The optoelectronic component according to claim 14, wherein the output coupling element comprises the roughness on a surface of the inorganic dielectric element facing away from the semiconductor layer sequence.

* * * * *